United States Patent
Chittipeddi et al.

(10) Patent No.: US 6,323,126 B1
(45) Date of Patent: Nov. 27, 2001

(54) TUNGSTEN FORMATION PROCESS

(75) Inventors: Sailesh Chittipeddi, Whitehall; Arun Kumar Nanda, Bethlehem, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 08/329,806

(22) Filed: Oct. 26, 1994

Related U.S. Application Data

(63) Continuation of application No. 08/141,780, filed on Oct. 22, 1993, now abandoned.

(51) Int. Cl.$^7$ ................................................ H01L 21/4763
(52) U.S. Cl. ........................ 438/648; 438/656; 438/672
(58) Field of Search .................................... 437/190, 192, 437/193; 438/648, 656, 672, 675, 680

(56) References Cited

U.S. PATENT DOCUMENTS

| | | | |
|---|---|---|---|
| 4,906,593 | * 3/1990 | Shioya et al. ......................... | 437/192 |
| 4,960,732 | * 10/1990 | Dixit et al. . | |
| 4,994,410 | * 2/1991 | Sun et al. ............................. | 437/192 |
| 5,084,413 | 1/1992 | Fujita et al. .......................... | 437/189 |
| 5,094,981 | * 3/1992 | Shung et al. ......................... | 437/190 |
| 5,141,897 | * 8/1992 | Manocha et al. .................... | 437/228 |
| 5,250,467 | * 10/1993 | Somekh et al. ...................... | 437/192 |

FOREIGN PATENT DOCUMENTS

| | | | |
|---|---|---|---|
| 0427254 | 12/1985 | (EP) . | |
| 0164976 | 5/1991 | (EP) . | |
| 62-243326 | 10/1987 | (JP) . | |
| 63-52441 | * 3/1988 | (JP) . | |
| 63-288046 | 11/1988 | (JP) . | |
| 2-90518 | * 3/1990 | (JP) . | |
| 4-120725 | 4/1992 | (JP) . | |
| 62-243325 | * 10/1987 | (JP) | ...................................... 437/192 |

OTHER PUBLICATIONS

Joshi, R. V., et al., "Collimated Sputtering of TiN/Ti . . . ", Appl. Phys. Lett., vol. 61, No. 21, Nov. 23, 1992, pp. 2613–2615.

Wolf., S., Silicon Processing, vol. 2, 1990, Lattice Press, pp. 240–254.*

* cited by examiner

*Primary Examiner*—T. N. Quach
(74) *Attorney, Agent, or Firm*—Anthony Grillo; John T. Rehberg

(57) ABSTRACT

A method for forming tungsten plugs and layers is disclosed. A thin layer of polysilicon or amorphous silicon is formed within a contact opening. The silicon is exposed to $WF_6$, thereby forming a tungsten plug.

9 Claims, 2 Drawing Sheets

TUNGSTEN FORMATION PROCESS

This application is a continuation of application Ser. No. 08/141,780, filed on Oct. 22, 1993, abandoned.

TECHNICAL FIELD

This invention relates to methods of semiconductor integrated circuit processing in general, and more particularly to integrated circuit processing methods which involve the use of tungsten conductors.

BACKGROUND OF THE INVENTION

Tungsten has become an increasingly popular material for semiconductor integrated circuit metallization. Tungsten has often been found superior to aluminum for the filling of vias and/or windows. There are two commonly used methods for forming tungsten. The first method, often termed "blanket tungsten" involves the reaction of tungsten hexaflouride ($WF_6$) and silane on an underlying nucleating substrate layer of TiN or TiW. The reaction produces a blanket layer of tungsten upon a substrate surface. The second method for forming tungsten, often termed "selective tungsten" involves the reaction of tungsten hexaflouride with silicon— typically a crystalline silicon substrate upon which integrated circuits are formed.

Those who employ selective tungsten to form a tungsten contact to a source/drain region (or other active silicon semiconductor region), often discover the subsequent formation of "worm holes." A worm hole is a microscopic tunnel formed in the silicon. The worm hole usually contains a small amount of tungsten material at its remote end. The presence of worm holes can destroy semiconductor junction integrity.

In an attempt to alleviate the worm hole problem, designers frequently deposit one or more barrier or glue layers within a window. The barrier or glue layer covers the exposed silicon of the source/drain region and helps to avoid the formation of worm holes. However, the presence of the barrier or glue layer precludes the use of selective tungsten because the crystalline silicon substrate is covered by the barrier or glue layer and therefore unavailable for reaction with $WF_6$. Consequently, a blanket tungsten reaction must be employed if a barrier/glue layer is used in a window.

A typically used barrier/glue layer is a bilayer of titanium/titanium nitride. Titanium is deposited within the window first. Then a layer of titanium nitride is formed atop the titanium. Next, a blanket tungsten layer is formed in contact with the titanium nitride layer. However, the first-deposited titanium layer forms a silicide with the underlying silicon substrate. The silicide formation may be undesirable if the underlying junction is extremely shallow.

Designers have consistently sought better methods of tungsten deposition.

SUMMARY OF THE INVENTION

The present invention provides a method of forming tungsten which alleviates the problems mentioned above. Illustratively, the invention includes:

forming a dielectric upon a substrate; and forming an opening in the dielectric exposing the substrate.

Then a layer of material chosen from the group consisting of polysilicon and amorphous silicon is formed within the opening and overlying the substrate and dielectric.

The layer of material is exposed to $WF_6$, thereby forming a tungsten plug within the opening.

DETAILED DESCRIPTION

Figure 1:
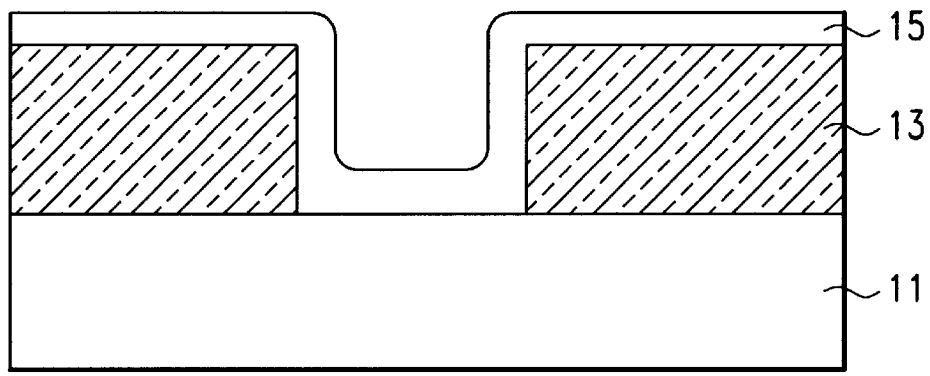
FIGS. 1–6 are cross-sectional views useful in understanding an illustrative embodiment of the present invention.

In FIG. 1, reference numeral 11 denotes a substrate. In general, the term "substrate" refers to a material upon which other materials may be formed or deposited. Substrate 11 may, for example, be silicon, epitaxial silicon, or doped silicon. Substrate 11 may contain a source or drain region. Alternatively, substrate 11 may represent the upper portion of a gate and, therefore, substrate 11 may be polysilicon or a silicide. Furthermore, substrate 11 may represent an aluminum, copper or tungsten conductor, such as the conductors typically found in upper levels of integrated circuits.

Reference numeral 13 denotes a dielectric. For example, dielectric 13 may be an oxide of silicon, such as a form of silicon dioxide formed by the decomposition of TEOS or another precursor.

Material layer 15 which is, illustratively, amorphous silicon or a polysilicon, is deposited with an opening 19 in dielectric 13. Layer 15 overlies substrate 11. The thickness of layer 15 may be 100–900 Å. Applicant has found that if opening 19 is one micron wide and 0.7 microns deep, the thickness of layer 15 is desirably 500 Å.

Figure 2:
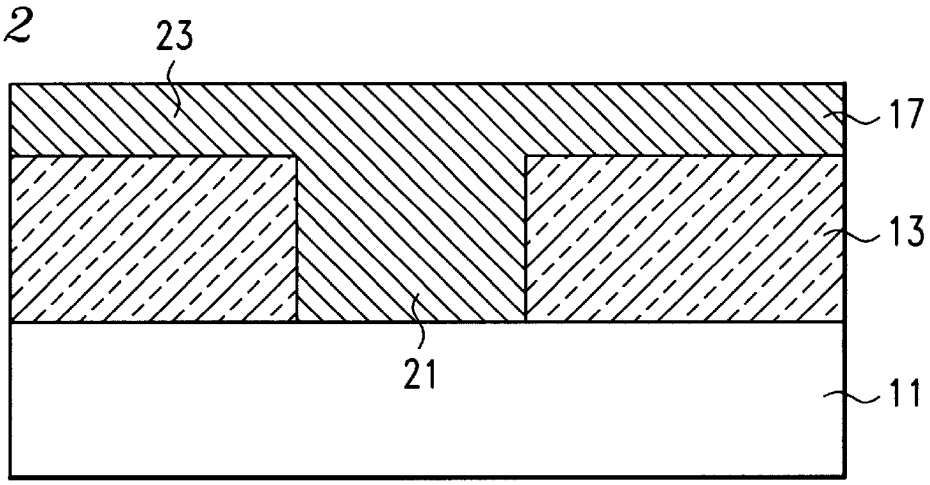

In FIG. 2, layer 15 has been exposed to a gas, such as $WF_6$. The reaction between layer 15 and $WF_6$ produces tungsten material layer denoted by reference numeral 17. It will be noted that a tungsten plug 21 which fills opening 19 and overlies substrate 11 is formed together with a blanket tungsten layer 23 overlying dielectric 13. If desired, the blanket portion 23 of tungsten layer 17 may be etched or polished away, leaving only plug 21. Alternatively, the blanket portion 23 of layer 17 may be patterned to form a conductive runner.

Figure 3:
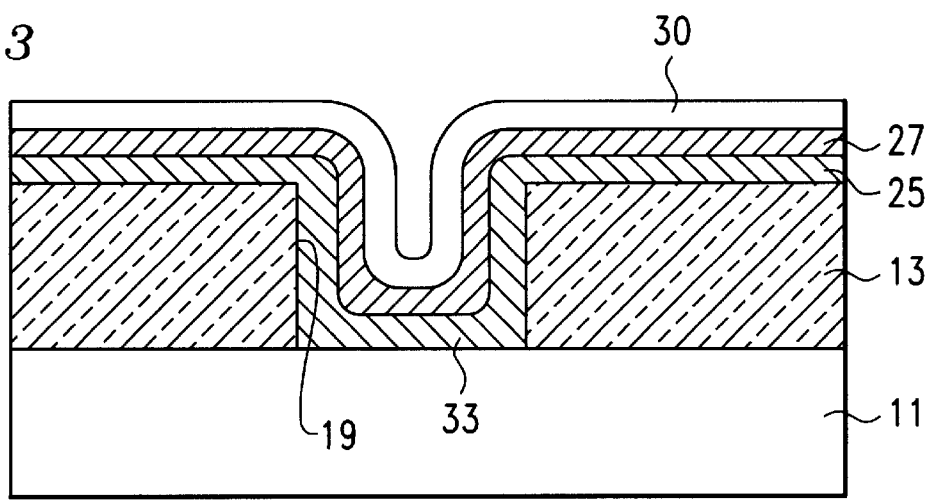
Figure 4:
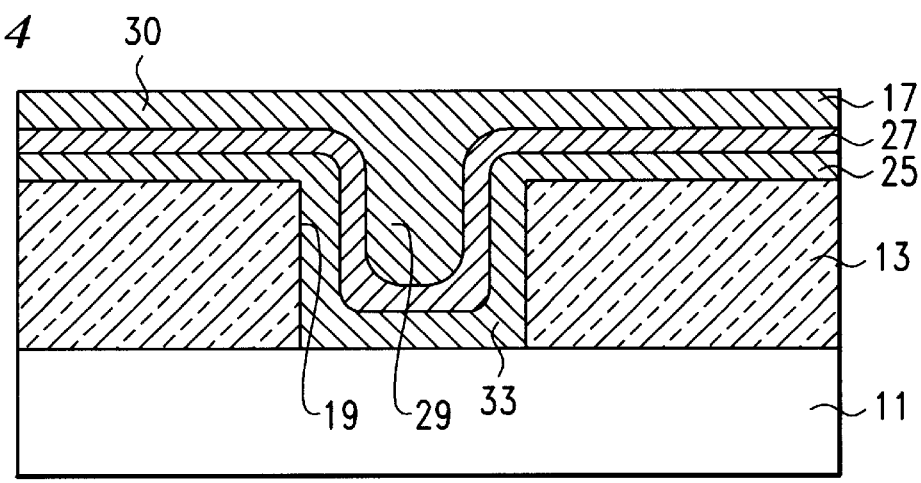

Another embodiment of the invention is depicted in FIGS. 3 and 4. In FIG. 3, reference numeral 25 denotes a refractory metal formed within opening 19 and the contacting substrate 11. Illustratively, reference numeral 25 may be a layer of titanium. Reference numeral 27 denotes a barrier/glue layer material such as titanium nitride (TiN), titanium tungsten (TiW) or zirconium nitride (ZrN). Layer 15 containing amorphous or polysilicon is deposited within opening 19 upon layer 27.

In FIG. 4, layer 15 has been exposed to $WF_6$, creating tungsten material layer 17 having plug 29 which fills opening 19 and layer portion 30 which overlies dielectric 13. Again, as mentioned before, tungsten material 17 may be etched back to form a plug or may be patterned to form conductive runners integral with the plug. Appropriate heating may cause that portion 33 of refractory metal 25 in contact with substrate 11 to form a silicide.

In another embodiment, only a single material layer, such as layer 25 or 27 comprised of either the disclosed materials or other materials having barrier or glue layer functions may be formed between layer 15 and substrate 11 within opening 19.

Figure 5:
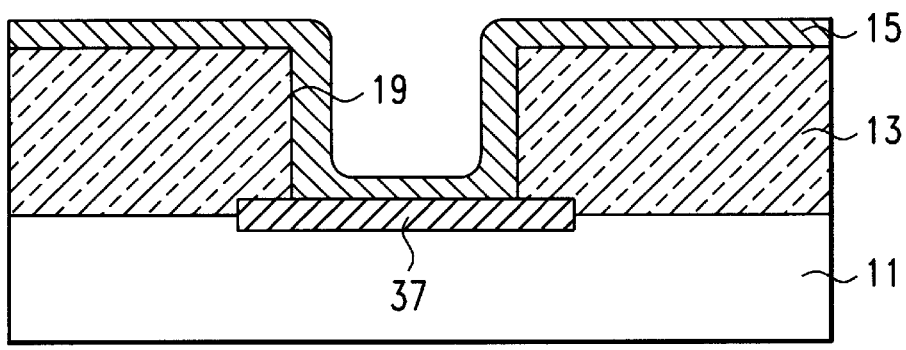
Figure 6:
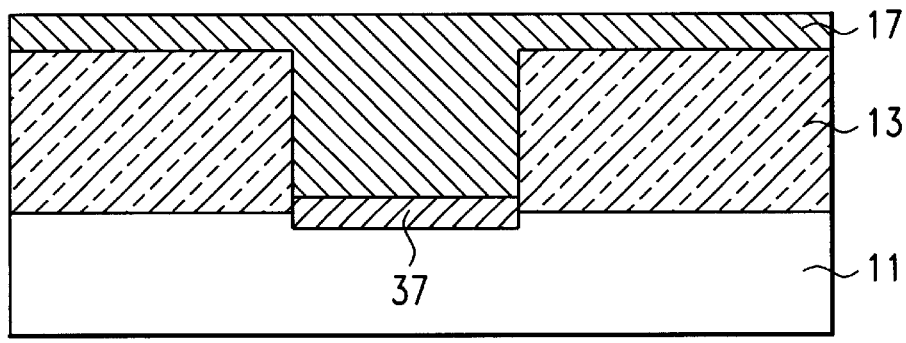

Another embodiment is illustrated in FIGS. 5 and 6. In FIG. 5, reference numeral 37 denotes a silicide which has been formed within opening 19 by a "self-aligned silicide process," i.e., a "silicide process." After silicide 37 is formed, layer 15 is deposited within opening 19. It will be noted that silicide 37 contacts substrate 11 (when substrate 11 contains a sufficient quantity of silicon) but does not extend along the vertical walls of opening 19.

Layer 15 is exposed to $WF_6$, creating tungsten material layer 17, depicted in FIG. 6. As mentioned before, the tungsten material layer 17 may be polished or patterned according to the designer's wishes. The present inventive process permits the use of selective tungsten despite the presence of silicide 37 in FIGS. 5–6.

Illustratively, in the above-described processes, the reaction between $WF_6$ and material layer 15 is performed using parameters known to those skilled in the art, such as a pressure of 0–15 mT and a temperature of 400–450° C.

What is claimed is:

1. A method of semiconductor integrated circuit fabrication comprising:

forming a dielectric upon a substrate;

forming an opening in said dielectric, exposing said substrate;

forming a layer of material chosen from the group consisting of polysilicon and amorphous silicon within said opening, and overlying all of the exposed portion of said substrate and said dielectric, said layer not completely filling said opening;

exposing said layer of material to $WF_6$, thereby forming a tungsten plug which completely fills said opening, and forming a tungsten layer which covers said dielectric;

etching said tungsten layer.

2. The method of claim 1 in which said substrate is a material chosen from the group consisting of crystalline silicon, doped silicon, epitaxial silicon, polysilicon, amorphous silicon, silicide, aluminum, copper and tungsten.

3. The method of claim 1 in which at least one additional material layer is formed between said substrate and said layer of material.

4. The method of claim 1 in which a layer of titanium is deposited within said opening prior to formation of said layer of material.

5. The method of claim 1 in which a layer of refractory metal is formed within said opening prior to formation of said layer of material.

6. The method of claim 5 in which a layer of material chosen from the group consisting of titanium nitride, titanium tungsten and zirconium nitride is formed upon said layer of refractory metal prior to formation of said layer of material.

7. The method of claim 1 in which said window exposes a silicide.

8. The method of claim 1 in which said exposing step creates a blanket layer of tungsten overlying said dielectric and in which said blanket layer is removed by said etching step.

9. The method of claim 1 in which said exposing step creates a blanket layer of tungsten overlying said dielectric and said blanket layer is patterned by said etching step to form a runner.

* * * * *